(12) United States Patent
Kim (10) Patent No.: US 7,271,496 B2
(45) Date of Patent: Sep. 18, 2007

(54) INTEGRATED CIRCUIT PACKAGE-IN-PACKAGE SYSTEM

(75) Inventor: Jong Kook Kim, Seoul (KR)

(73) Assignee: Stats Chippac Ltd., Singapore (SG)

( * ) Notice: Subject to any disclaimer, the term of this patent is extended or adjusted under 35 U.S.C. 154(b) by 124 days.

(21) Appl. No.: 11/162,637

(22) Filed: Sep. 16, 2005

(65) Prior Publication Data

US 2006/0189033 A1    Aug. 24, 2006

Related U.S. Application Data

(60) Provisional application No. 60/650,064, filed on Feb. 4, 2005.

(51) Int. Cl.
   *H01L 23/52*   (2006.01)
   *H01L 23/29*   (2006.01)
   *H01L 23/02*   (2006.01)

(52) U.S. Cl. ............... 257/778; 257/790; 257/678; 257/777

(58) Field of Classification Search ............... None
   See application file for complete search history.

(56) References Cited

U.S. PATENT DOCUMENTS 6,731,003 B2   5/2004   Joshi et al.
6,835,580 B1   12/2004   Knapp et al.
6,855,572 B2   2/2005   Jeung et al.
6,856,017 B2   2/2005   Yoneda et al.
6,856,025 B2   2/2005   Pogge et al.
7,129,583 B2 * 10/2006   Tao et al. ............. 257/777
2004/0113254 A1* 6/2004   Karnezos ............. 257/686
2004/0238933 A1 12/2004   Chen et al.
2005/0029642 A1 2/2005   Takaya et al.

FOREIGN PATENT DOCUMENTS

AU   2003218085   9/2003
JP   2004327724   11/2004
WO   WO/2005008724 A2   1/2005

* cited by examiner

*Primary Examiner*—Zandra V. Smith
*Assistant Examiner*—Kiesha Rose
(74) *Attorney, Agent, or Firm*—Mikio Ishimaru (57) ABSTRACT

A package-in-package system is provided including forming a top substrate having a first integrated circuit electrically connected thereto and mounting a second integrated circuit over the first integrated circuit. The system includes forming first electrical connectors on the second integrated circuit and encapsulating the second integrated circuit in a first encapsulant with the first electrical connectors exposed. The system includes mounting the second integrated circuit over a bottom substrate with the first electrical connectors electrically connected thereto and encapsulating the top substrate and the first encapsulant in a second encapsulant.

20 Claims, 5 Drawing Sheets

INTEGRATED CIRCUIT PACKAGE-IN-PACKAGE SYSTEM

CROSS-REFERENCE TO RELATED APPLICATION(S)

This application claims the benefit of U.S. Provisional Patent Application Ser. No. 60/650,064 filed Feb. 4, 2005, and the subject matter thereof is hereby incorporated herein by reference thereto.

TECHNICAL FIELD

The present invention relates generally to integrated circuit package systems, and more particularly to a system for multi-chip modules (MCM), chip scale packages (CSP) or Package-in-Package (PIP).

BACKGROUND ART

Multi-chip devices can be fabricated faster and more cheaply than a corresponding single integrated circuit, which incorporates the same or different functions. Current multi-chip module construction typically consists of a printed circuit board substrate to which a series of separate components are directly attached. This technology is advantageous because of the increase in circuit density achieved. With increased density comes improvement in signal propagation speed and overall device weight required for the consumer electronics application, such as in cellular phones, and personal digital assistance (PDA). While integrated circuit density increases at a significant rate, the interconnection density has become a significant limiting factor in the quest for miniaturization. Key features that are required in the minimization are high density circuit packing, low cost, reliable interconnect methodology and small package profiles.

Multi-chip modules (MCM), chip scale packages (CSP), or package-in-package (PIP) usually use the wire bonding method or solder bump flip-chip method. Wire bonding increases the overall package thickness, width, area, and footprint. Solder bump flip-chip bonding is subject to integrated circuit damage problems and cannot form stacked integrated circuit packages.

Thus, a need still remains for an integrated circuit package to reduce the package size, prevent integrated circuit damage, and stud bump deformation as well as allow multi-stack flip-chip packages. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a package-in-package system including forming a top substrate having a first integrated circuit electrically connected thereto and mounting a second integrated circuit over the first integrated circuit. The system includes forming first electrical connectors on the second integrated circuit and encapsulating the second integrated circuit in a first encapsulant with the first electrical connectors exposed. The system includes mounting the second integrated circuit over a bottom substrate with the first electrical connectors electrically connected thereto and encapsulating the top substrate and the first encapsulant in a second encapsulant.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. Generally, the device can be operated in any orientation. The same numbers are used in all the figures to relate to the same elements.

The term "horizontal" as used herein is defined as a plane parallel to the conventional plane or surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on"is defined as one element being in direct physical contact with another.

The term "processing"as used herein includes deposition of material or photoresist, patterning, exposure, development, etching, cleaning, and/or removal of the material or photoresist as required in forming a described structure.

Figure 1:
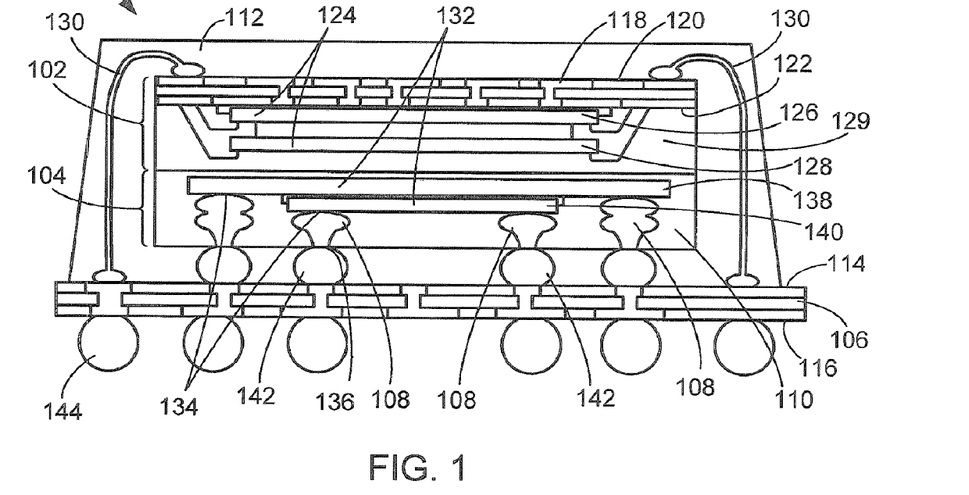
FIG. 1 is a cross-sectional view of an integrated circuit package-in-package system in an embodiment of the present invention.

Referring now to FIG. 1, therein is shown a cross-sectional view of an integrated circuit package-in-package system 100 in an embodiment of the present invention. The integrated circuit package-in-package system 100 includes a top package 102 above a bottom package 104 mounted on a bottom substrate 106. The bottom package 104 further includes a plurality of stud bumps 108 or electrical connectors for electrical connectivity of the bottom package 104 to the bottom substrate 106. An encapsulant 110, such as an organic encapsulant, encapsulates the bottom package 104 including the plurality of stud bumps 108. An encapsulant 112 molds the top package 102 and the bottom package 104 to the bottom substrate 106. The bottom substrate 106 includes a top surface 114 and a bottom surface 116.

The top package 102 includes a top substrate 118, wherein the top substrate 118 includes a top surface 120 and a bottom surface 122. A first set of integrated circuits 124 having a first integrated circuit 126 and a second integrated circuit 128 is electrically mounted to the bottom surface 122. The first set of integrated circuits 124 is encapsulated in a top encapsulant 129. A plurality of wire bonds 130 electrically couples the top surface 120 of the top substrate 118 to the top surface 114 of the bottom substrate 106.

The bottom package 104 includes a second set of integrated circuits 132 and the plurality of stud bumps 108 encapsulated by the encapsulant 110. Each of the plurality of stud bumps 108 includes a first side 134 and a second side 136. The second set of integrated circuits 132 includes a first integrated circuit 138 and a second integrated circuit 140. The first integrated circuit 138 and the second integrated circuit 140 mechanically and electrically attach to the first side 134 of the plurality of stud bumps 108. The second side 136 mechanically and electrically attaches to a first set of solder balls 142, further electrical connectors, which further mechanically and electrically connect to the top surface 114 of the bottom substrate 106. A ball grid array 144 on the bottom of the bottom substrate 106 is connected by vias to a wiring pattern on the top surface 114 of the bottom substrate 106.

The bottom substrate 106 is provided with the ball grid array 144, electrical connectors, which can be used to electrically connect the integrated circuit package-in-package system 100 to a printed circuit board (not shown).

For illustrative purpose, the first integrated circuit 126 and the second integrated circuit 128 are shown in a stacked orientation, although it is also understood that the orientation of the first and second integrated circuits 126 and 128 need not be stacked, staggered or a combination thereof. Further, it is understood the number of dice, size, and functions need not be similar.

Figure 2:
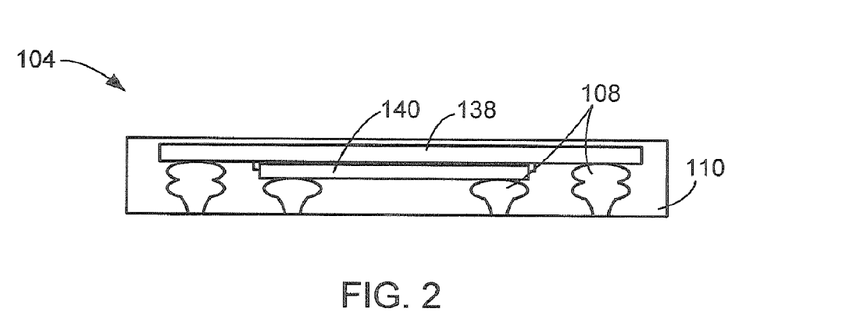
FIG. 2 is a more detailed cross-sectional view of the bottom package shown in FIG. 1.

Referring now to FIG. 2, therein is shown a more detailed cross-sectional view of the conductive wires, solder, or bumps of a material such as gold or copper. The plurality of stud bumps 108 provides electrical conduction paths from the first integrated circuit 138 and the second integrated circuit 140 to the first set of solder balls 142 shown in FIG. 1.

The encapsulant 110 encapsulates the plurality of stud bumps 108, the first integrated circuit 138, and the second integrated circuit 140. The encapsulant 110 further provides structural support to the plurality of stud bumps 108 to relieve the stress on the first integrated circuit 138 and the second integrated circuit 140. This minimizes the damage to the first and second integrated circuit 138, 140 as well as avoids deforming the plurality of stud bumps 108 during further assembly. The encapsulant 110 also prevents damage to the connection between the plurality of stud bumps 108 and the first integrated circuit 138 and the second integrated circuit 140 during later assembly stages. The encapsulant 110 also provides electrical insulation between each of the plurality of stud bumps 108.

For illustrative purpose, the first integrated circuit 138 and the second integrated circuit 140 are shown in a stacked orientation, although it is also understood the orientation of the first and second integrated circuits 138 and 140 need not be stacked. Further, it is understood the number of dice, size, and functions need not be similar.

It is also understood that the plurality of stud bumps 108 may include different alloys, such as any conductive material, and may also include other forms and structures, such as conductive posts. Further, it is understood that the location of the plurality of stud bumps 108 need not only be at the peripheral boundary of the first integrated circuit 138 and the second integrated circuit 140. The encapsulant 110 need not completely encapsulate the plurality of stud bumps 108 whereby the space between the plurality of stud bumps 108 is completely filled. The encapsulant 110 may coat the plurality of stud bumps 108 to provide sufficient mechanical rigidity.

Figure 3:
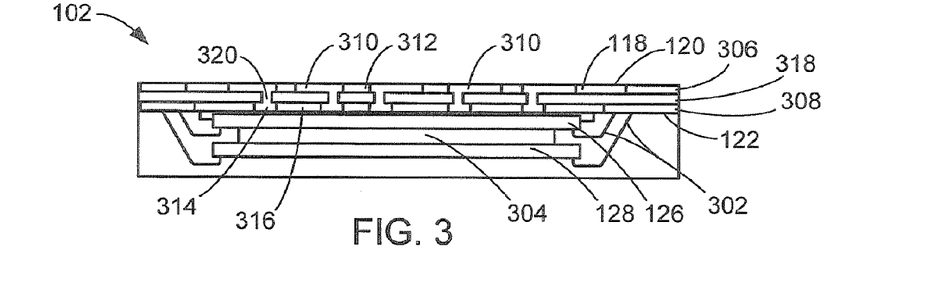
FIG. 3 is a more detailed cross-sectional view of the top package shown in FIG. 1.

Referring now to FIG. 3, therein is shown a more detailed cross-sectional view of the top package 102 shown in FIG. 1. A plurality of wire bonds 302 electrically couples the first integrated circuit 126 and the second integrated circuit 128 to the bottom surface 122 of the top substrate 118. An adhesive spacer 304 mechanically connects the first integrated circuit 126 and the second integrated circuit 128 while providing space for the plurality of wire bonds 302. It is understood that other mechanical attachment techniques may be used between the first integrated circuit 126 and the second integrated circuit 128.

The top substrate 118 includes a top layer 306 with the top surface 120 and a bottom layer 308 with the bottom surface 122. The top layer 306 includes a plurality of metallic regions 310 and a plurality of non-metallic regions 312. The plurality of metallic regions 310 provides signal conduction paths, voltage supply, ground, and other electrical functions. The plurality of non-metallic regions 312 insulates the plurality of metallic regions 310. The bottom layer 308 includes a plurality of metallic regions 314 and a plurality of non-metallic regions 316. The plurality of metallic regions 314 provides signal conduction paths, voltage supply, ground, and other electrical functions. The plurality of non-metallic regions 316 insulates the plurality of metallic regions 310.

A dielectric layer 318 insulates and separates the top layer 306 from the bottom layer 308. A plurality of electrical vias 320 provides selective electrical connections between the plurality of metallic regions 310 of the top layer 306 to the plurality of metallic regions 314 of the bottom layer 308.

It is understood that other electrical connectivity techniques may be used to electrically connect the first integrated circuit 126 and the second integrated circuit 128 to the top substrate 118, such as with direct attach, flip chip, or tape automated bonding (TAB). Further, it is understood the number of layers and the construction of the top substrate 118 may differ.

Figure 4:
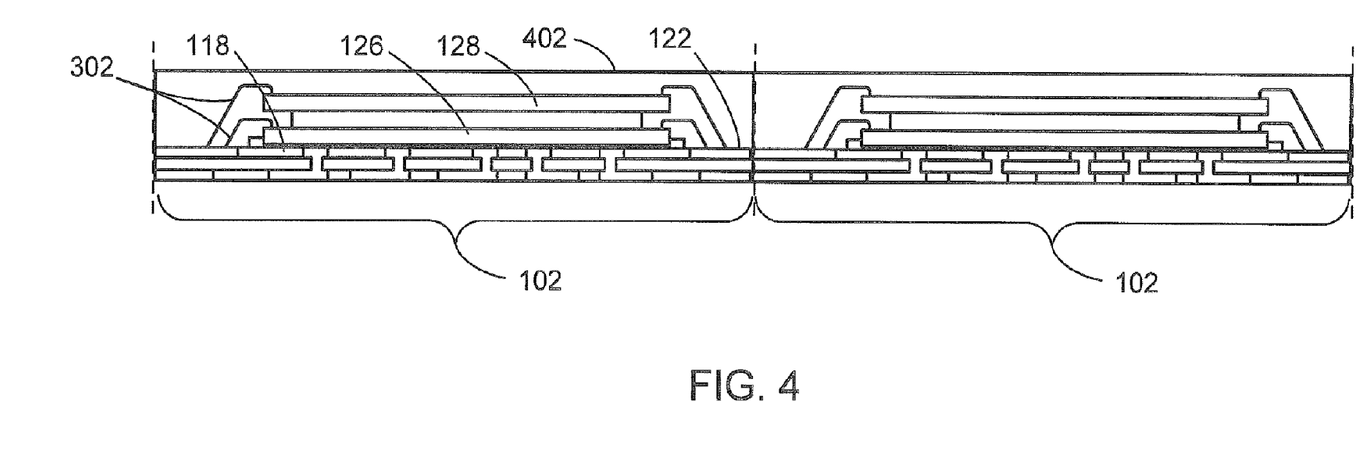
FIG. 4 is a cross-sectional view of the top package in a unsingulated phase of the assembly process for the integrated circuit package-in-package system.

Referring now to FIG. 4, therein is shown a cross-sectional view of the top package 102 in a unsingulated phase of the assembly process for the integrated circuit package-in-package system 100. A top package mold 402 encapsulates a plurality of the top package 102 prior to singulation. For each of the top package 102, unsingulated, the top package mold 402 encapsulates the first integrated circuit 126 stacked below the second integrated circuit 128 electrically mounted on the bottom surface 122 of the top substrate 118. The top package mold 402 further protects the mechanical contacts of the plurality of wire bonds 302 between the first integrated circuit 126 and the second integrated circuit 128 to the bottom surface 122.

Figure 5:
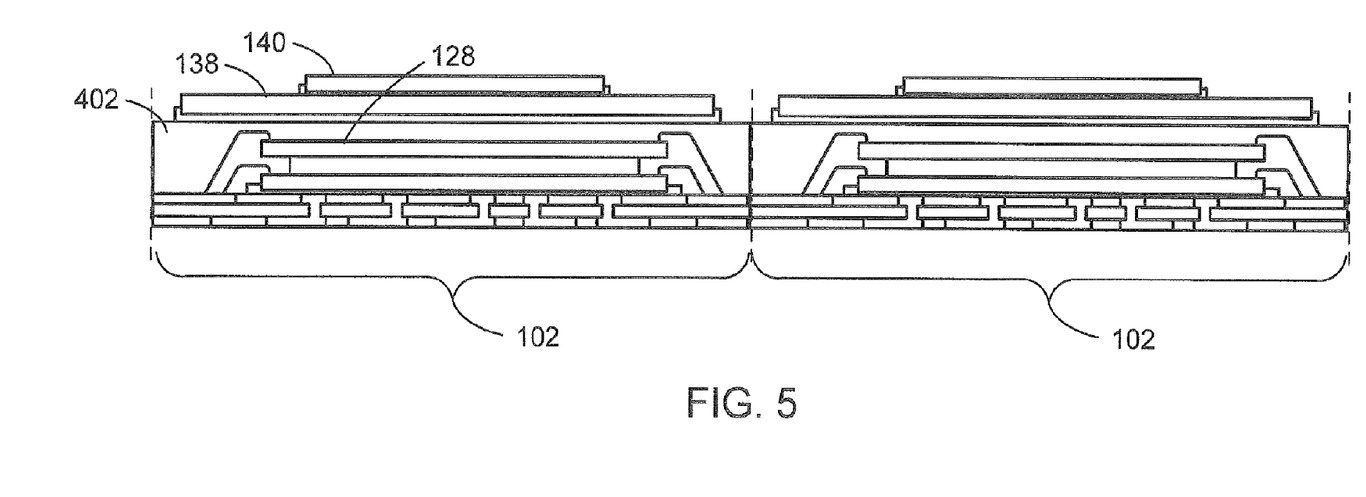
FIG. 5 is a cross-sectional view of the top package in a secondary die attach phase, after the unsingulated phase shown in FIG. 4.

Referring now to FIG. 5, therein is shown a cross-sectional view of the top package 102 in a secondary die attach phase, after the unsingulated phase shown in FIG. 4. The first integrated circuit 138 of the bottom package 104 of FIG. 3 mechanically attaches to the top package mold 402. The second integrated circuit 140 of the bottom package 104 of FIG. 3 mechanically attaches above the first integrated circuit 138. The first integrated circuit 138 size and the second integrated circuit 140 size are tapered in a manner to provide space for the plurality of stud bumps 108 of FIG. 2.

For illustrative purposes, the first integrated circuit 138 size is depicted as larger than the second integrated circuit 140 size, although it is understood that the space for the plurality of stud bumps 108 need not be provided by differing integrated circuit sizes by other mechanisms such as by different integrated circuit positions, or a combination thereof. Further, it is understood that the first integrated circuit 138 need not attach to the top package mold 402 as described above. Alternatively, the first integrated circuits 138 may be attached directly to the first set of integrated circuits 124.

Figure 6:
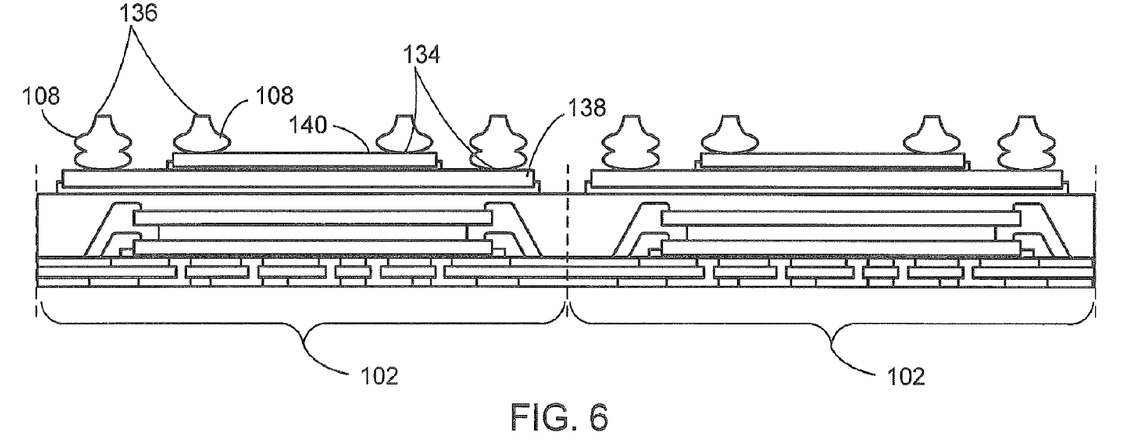
FIG. 6 is a cross-sectional view of the top package in a stud bump phase, after the secondary die attach phase shown in FIG. 5.

Referring now to FIG. 6, therein is shown a cross-sectional view of the top package 102 in a stud bump phase, after the secondary die attach phase shown in FIG. 5. The first side 134 of the plurality of stud bumps 108 electrically and mechanically attaches to the first integrated circuit 138 and the second integrated circuit 140. The second side 136 of the plurality of stud bumps 108 is shown unconnected.

Figure 7:
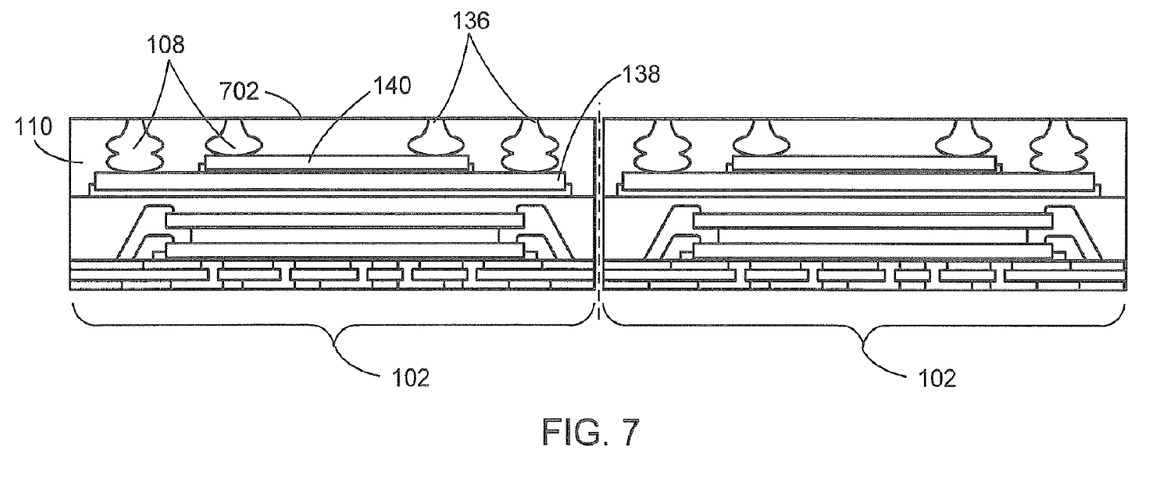
FIG. 7 is a cross-sectional view of the top package in a coating phase, after the stud bump phase shown in FIG. 6.

Referring now to FIG. 7, therein is shown is a cross-sectional view of the top package 102 in a coating phase, after the stud bump phase shown in FIG. 6. The encapsulant 110 encapsulates and molds around the plurality of stud bumps 108, the first integrated circuit 138, and the second integrated circuit 140. A top surface 702 results from the encapsulant 110. The top surface 702 is polished to level the surface and expose the second side 136 of the plurality of stud bumps 108, wherein the second side 136 provides the electrical connectivity with the first integrated circuit 138 and the second integrated circuit 140 to the bottom substrate 106 of FIG. 1.

Figure 8:
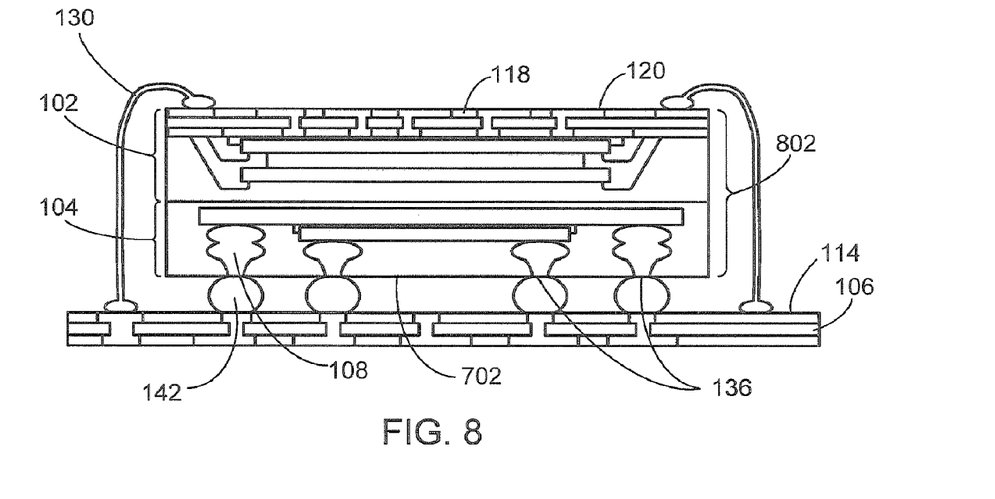
FIG. 8 is a cross-sectional view of a singulated structure in a singulated phase, after the coating phase shown in FIG. 7.

Referring now to FIG. 8, therein is shown a cross-sectional view of a singulated structure 802 in a singulated phase, after the coating phase shown in FIG. 7. The singulated structure 802 includes the top package 102 and the bottom package 104, and has been flipped from its manufactured position of FIG. 7. The first set of solder balls 142 electrically and mechanically attaches the second side 136 of the plurality of stud bumps 108 to the top surface 114 of the bottom substrate 106. The plurality of wire bonds 130 electrically couples the top surface 120 of the top substrate 118 to the top surface 114 of the bottom substrate 106 as in FIG. 1. This phase results in both the top package 102 and the bottom package 104 being electrically coupled to the bottom substrate 106.

Figure 9:
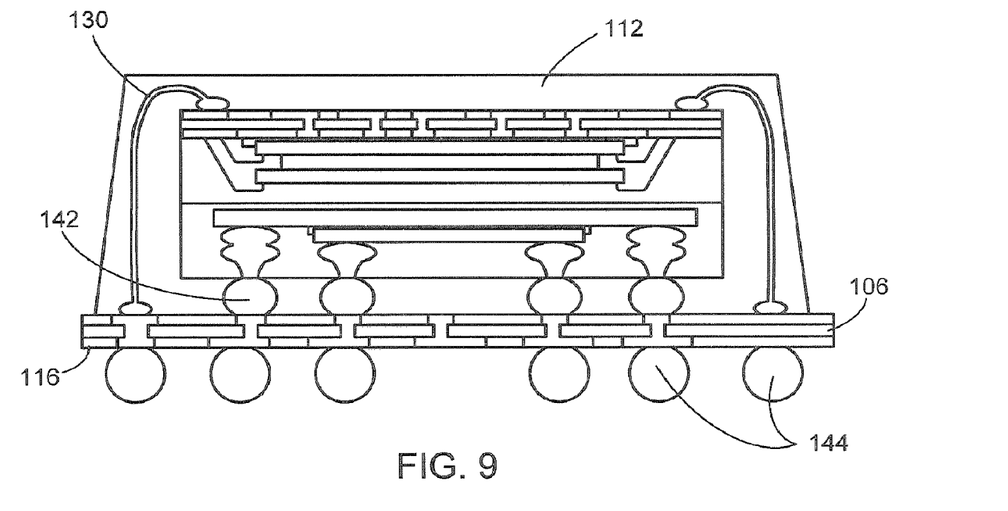
FIG. 9 is a cross-sectional view of the integrated circuit package-in-package system in an overall encapsulation phase, after the singulated phase shown in FIG. 8.

Referring now to FIG. 9, therein is shown a cross-sectional view of the integrated circuit package-in-package system 100 in an overall encapsulation phase, after the singulated phase shown in FIG. 8. This phase encapsulates the top package 102, the bottom package 104, the first set of solder balls 142, and the plurality of wire bonds 130 with the encapsulant 112. The encapsulant 112 provides mechanical rigidity to the structure after the singulation phase and protects the mechanical contacts of the plurality of wire bond 130 to the top package 102 and the bottom substrate 106.

Figure 10:
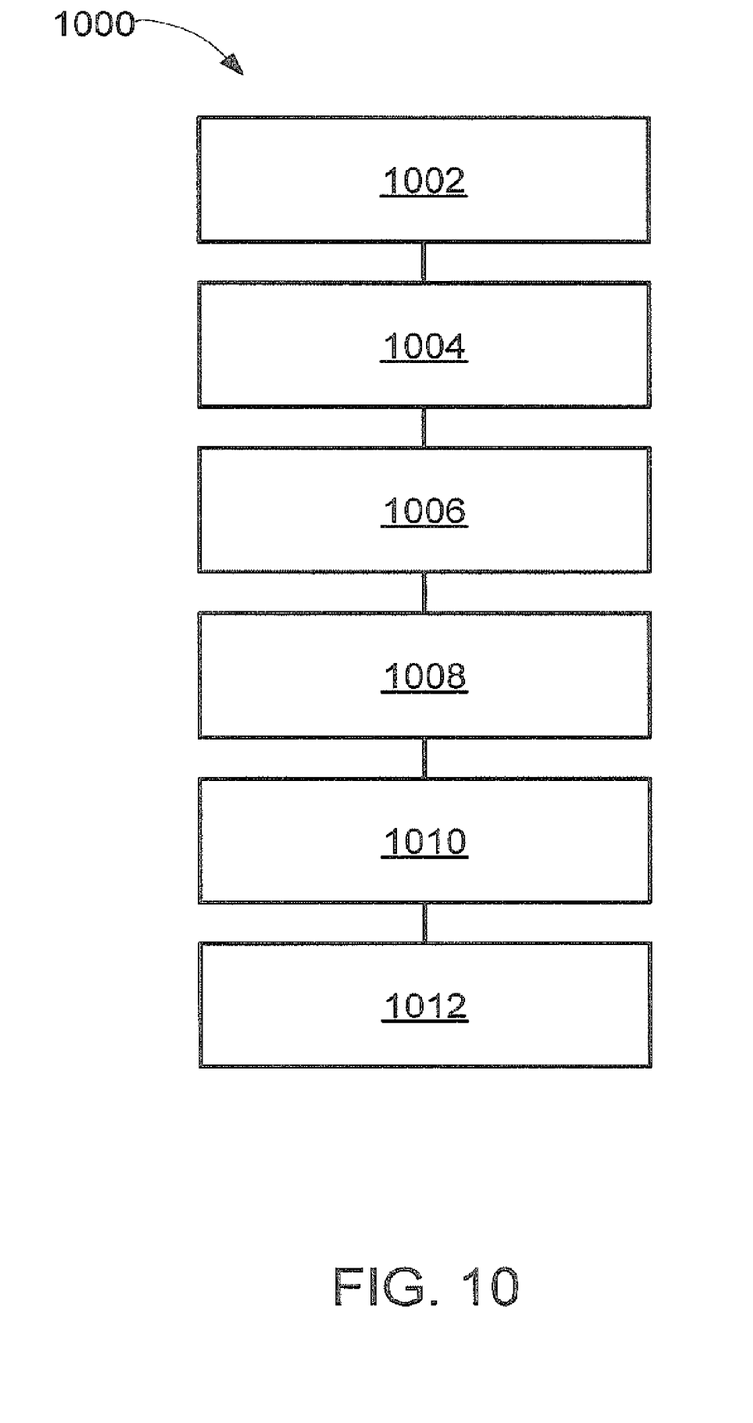
FIG. 10 is a flow chart of a package-in-package system for manufacturing an integrated circuit package-in-package system in a further embodiment of the present invention.

Referring now to FIG. 10, therein is shown a flow chart of a package-in-package system 1000 for manufacturing an integrated circuit package-in-package system 100 in a further embodiment of the present invention. The system 1000 includes forming a top substrate having a first integrated circuit electrically connected thereto in a step 1002; mounting a second integrated circuit over the first integrated circuit in a step 1004; forming first electrical connectors on the second integrated circuit in a step 1006; encapsulating the second integrated circuit in a first encapsulant with the first electrical connectors exposed in a step 1008; mounting the second integrated circuit over a bottom substrate with the first electrical connectors electrically connected thereto in a step 1010; and encapsulating the top substrate and the first encapsulant in a second encapsulant in a step 1012.

In greater detail, a method to assemble the integrated circuit package-in-package system 100 utilizing an encapsulated stud bump process according to an embodiment of the present invention, is performed as follows:

(1) Starting with the top package 102, an assembled stacked integrated circuits package utilizing die attach and wire bonding and molding, such as plastic transfer molding processes. (FIG. 4)

(2) A secondary die-attach process to mechanically attach the first integrated circuit 138 to the top package mold 402 and mechanically attaches the second integrated circuit 140 to the first integrated circuit 138. (FIG. 5)

(3) The stud bump process electrically and mechanically attaches the plurality of stud bumps 108 to the first integrated circuit 138 and the second integrated circuit 140. (FIG. 6)

(4) The encapsulant 110 encapsulates and coats the plurality of stud bumps 108 creating the top surface 702 which undergoes polishing to expose the plurality of stud bumps 108. (FIG. 7)

(5) The singulated structure 802 mechanically and electrically attaches the first set of solder balls 142 and the plurality of wire bonds 130 to the top surface 114 of the bottom substrate 106. (FIG. 8)

(6) The resulting in the integrated circuit package-in-package system 100 is encased with the encapsulant 112 with the ball grid array 144 attached to the bottom surface 116 of the bottom substrate. (FIG. 9)

An advantage is the coating of the plurality of stud bumps 108 with the encapsulant 110 prevents the plurality of stud bumps 108 from deforming during processing and protects the integrated circuits encased within. The plurality of stud bumps 108 provides a high density electrical connectivity for integrated circuits using low cost materials and manufacturing techniques.

It has been discovered that the disclosed structure results in the reduction of the overall system dimension from reduced physical dimension required by the plurality of stud bumps 108 as opposed to wire bond techniques. The plurality of stud bumps 108 provides an additional packaging option with low package height and increased number of stacked integrated circuits.

Yet another discovery of the present invention is to be able to provide lower power from the first set of integrated circuits 124 and the second set of integrated circuits 132 resulting from the shorter physical distance for electrical signal to transmit between the top package 102 and the bottom package 104. This shorter distance results in drive strength reduction of the electrical signals only to what is necessary for transmission.

Again, yet another discovery of the present invention is the additional degrees of freedom provide solutions that increase electrical connectivity between the bottom package 104, the top package 102, and the external printed circuit board (not shown). The increased electrical connectivity provides for signal shielding and electro-magnetic interference (EMI) shielding resulting in improved signal integrity, lower bit error rate, and overall system performance.

Again, another discovery of the present invention is that the increased electrical connectivity from the plurality of stud bumps 108 provides additional testability probe points for the bottom package 104, between the top package 102 and the bottom package 104, and the integrated circuit package-in-package system 100. The additional probe points may be used for test during assembly and final test to reduce scrap materials and improve end product yield.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the stud bump coating method and apparatus of the present invention furnish important and heretofore unknown and unavailable solutions, capabilities, and functional advantages for increasing chip density in systems while making the multiple device packages easier to manufacture reliably. The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A package-in-package system comprising:
   forming a top substrate having a first integrated circuit electrically connected thereto;
   mounting a second integrated circuit over the first integrated circuit;
   forming first electrical connectors on the second integrated circuit;
   encapsulating the second integrated circuit in a first encapsulant with the first electrical connectors exposed;
   mounting the second integrated circuit over a bottom substrate with the first electrical connectors electrically connected thereto; and
   encapsulating the top substrate and the first encapsulant in a second encapsulant.

2. The system as claimed in claim 1 further comprising encapsulating the first integrated circuit in a third encapsulant.

3. The system as claimed in claim 1 further comprising electrically connecting the top and bottom substrates.

4. The system as claimed in claim 1 further comprising:
   forming second electrical connectors on the bottom substrate; and
   electrically connecting the first electrical connectors to the second electrical connectors.

5. The system as claimed in claim 1 further comprising forming third electrical connectors on the bottom of the bottom substrate electrically connected to the top substrate and the first electrical connectors.

6. A package-in-package system comprising:
   forming a top substrate having a first set of integrated circuits electrically connected by wire bonds thereto;
   mounting a second set of integrated circuits over the first set of integrated circuits;
   forming stud bumps on the second set of integrated circuits;
   encapsulating the second set of integrated circuits in a first encapsulant with the stud bumps exposed;
   flipping the second set of integrated circuits over a bottom substrate to mount the second set of integrated circuits with the stud bumps electrically connected thereto; and
   encapsulating the top substrate and the first encapsulant in a second encapsulant.

7. The system as claimed in claim 6 further comprising encapsulating the first set of integrated circuits in a third encapsulant.

8. The system as claimed in claim 6 further comprising electrically connecting the top and bottom substrates by wire bonding.

9. The system as claimed in claim 6 further comprising:
   forming solder balls on the bottom substrate; and
   electrically connecting the stud bumps to the solder balls.

10. The system as claimed in claim 6 further comprising forming a ball grid array on the bottom of the bottom substrate electrically connected to the top substrate and the stud bumps.

11. A package-in-package system comprising:
    a top substrate;
    a first integrated circuit electrically connected to the top substrate;
    a second integrated circuit over the first integrated circuit;
    first electrical connectors on the second integrated circuit;
    a first encapsulant encapsulating the second integrated circuit with the first electrical connectors exposed;
    a bottom substrate having the second integrated circuit electrically connected thereto by the first electrical connectors; and
    a second encapsulant encapsulating the top substrate.

12. The system as claimed in claim 11 further comprising a third encapsulant encapsulating the first integrated circuit.

13. The system as claimed in claim 11 further comprising wire bonds electrically connecting the top and bottom substrates.

14. The system as claimed in claim 11 further comprising:
    second electrical connectors on the bottom substrate; and
    the first electrical connectors electrically connected to the second electrical connectors.

15. The system as claimed in claim 11 further comprising third electrical connectors on the bottom of the bottom substrate and electrically connected to the top substrate and the first electrical connectors.

16. A package-in-package system comprising:
    a top substrate;
    a first set of integrated circuits electrically connected by wire bonds to the top substrate;
    a bottom substrate;

a second set of integrated circuits mounted over the first set of integrated circuits, the second set of integrated circuits having stud bumps thereon and encapsulated in a first encapsulant with the stud bumps exposed, the second set of integrated circuits over the bottom substrate with the stud bumps electrically connected thereto; and a second encapsulant encapsulating the top substrate and the first encapsulant.

17. The system as claimed in claim 16 further comprising a third encapsulant encapsulating the first set of integrated circuits.

18. The system as claimed in claim 16 further comprising bond wires electrically connecting the top and bottom substrates.

19. The system as claimed in claim 16 further comprising solder balls on the bottom substrate electrically connected to the stud bumps.

20. The system as claimed in claim 16 further comprising a ball grid array on the bottom of the bottom substrate electrically connected to the top substrate and the stud bumps.

* * * * *